United States Patent
Dekker et al.

(10) Patent No.: US 7,292,310 B2
(45) Date of Patent: Nov. 6, 2007

(54) LITHOGRAPHIC APPARATUS AND A DEVICE MANUFACTURING METHOD

(75) Inventors: Maarten Constant Bernhard Dekker, Veldhoven (NL); Edwin Eduard Nicolaas Josephus Krijnen, Oss (NL)

(73) Assignee: ASML Netherlands B.V., Veldhoven (NL)

( * ) Notice: Subject to any disclaimer, the term of this patent is extended or adjusted under 35 U.S.C. 154(b) by 185 days.

(21) Appl. No.: 10/882,671

(22) Filed: Jul. 2, 2004

(65) Prior Publication Data

US 2006/0001850 A1    Jan. 5, 2006

(51) Int. Cl.
G03B 27/42    (2006.01)
G03B 27/32    (2006.01)

(52) U.S. Cl. .......................................... 355/53; 355/77

(58) Field of Classification Search ................... 355/53, 355/77; 411/134; 345/82
See application file for complete search history.

(56) References Cited

U.S. PATENT DOCUMENTS

| | | | | |
|---|---|---|---|---|
| 6,019,556 A | * | 2/2000 | Hess | 411/134 |
| 6,246,202 B1 | * | 6/2001 | Lee | 318/649 |
| 2002/0022843 A1 | * | 2/2002 | Michelson | 606/70 |
| 2002/0097205 A1 | * | 7/2002 | Nakamura | 345/82 |

* cited by examiner

*Primary Examiner*—Peter B. Kim
(74) *Attorney, Agent, or Firm*—Pillsbury Winthrop Shaw Pittman LLP (57) ABSTRACT

A lithographic apparatus and device manufacturing method are disclosed. The apparatus includes an illumination system for conditioning a beam of radiation, and a support structure for supporting a patterning device. The patterning device serves to impart the beam of radiation with a pattern in its cross-section. The apparatus also includes a substrate table for holding a substrate, a projection system for projecting the patterned beam onto a target portion of the substrate, and at least one fastener for fastening a first part of the apparatus to a second part of the apparatus. The fastener includes a shaft having a first threaded section and a second threaded section. The first threaded section and the second threaded section have different pitches.

53 Claims, 4 Drawing Sheets

PRIOR ART

LITHOGRAPHIC APPARATUS AND A DEVICE MANUFACTURING METHOD

FIELD

The present invention relates to a lithographic apparatus, a device manufacturing method, and a device manufactured thereby.

BACKGROUND

A lithographic apparatus is a machine that applies a desired pattern onto a target portion of a substrate. Lithographic apparatus can be used, for example, in the manufacture of integrated circuits (ICs). In that circumstance, a patterning device, such as a mask, may be used to generate a circuit pattern corresponding to an individual layer of the IC, and this pattern can be imaged onto a target portion (e.g. comprising part of, one or several dies) on a substrate (e.g. a silicon wafer) that has a layer of radiation-sensitive material (resist). In general, a single substrate will contain a network of adjacent target portions that are successively exposed. Known lithographic apparatus include so-called steppers, in which each target portion is irradiated by exposing an entire pattern onto the target portion in one go, and so-called scanners, in which each target portion is irradiated by scanning the pattern through the projection beam in a given direction (the "scanning"-direction) while synchronously scanning the substrate parallel or antiparallel to this direction.

In the lithographic apparatus, various parts are fastened to one another using a fastener. It is known, for example, to use bolt or screw fasteners for fastening apparatus parts. For example, a first apparatus part, such as an optical component, may be clamped onto a second apparatus part, such as a base, using one or more such fasteners.

The known bolt or screw fastener includes a shaft having screw thread of a certain pitch, as well as a driving head for driving the bolt or screw into a suitable aperture of a respective apparatus part. After assembly, the bolt or screw clamps the apparatus parts together, using cooperation of the screw thread of the shaft and the screw aperture, and the driving head.

Particularly, in the known apparatus, the fastener can be used for locking an apparatus component in a desired position onto a base part of the apparatus. However, the known fastener tends to displace the apparatus component during assembly, when the fastener is being driven to a locking position. Such a displacement may involve, for example, a rotation and/or translation. After assembly, the fastener may induce internal stresses in the component which is locked into position by the fastener. Such stresses may result in unwanted positional and rotational drift of the component. Such drift of apparatus components may hamper a desired operating accuracy of the apparatus, making it difficult, if not impossible, to manufacture devices with desired small features using a lithographic process.

Further, a certain torque is applied during assembly to create a certain clamping force between the apparatus component and the base part. This torque is induced into the apparatus component via the screwhead pivot face (and thread windings engaged of the fastener), causing deformations in weak sections of the apparatus component as well as internal material stress. This is a second potential source of undesired positional and/or rotational drift of the apparatus component after assembly.

SUMMARY

An aspect of the invention is to provide a lithographic apparatus and device manufacturing method, which can manufacture devices having small features with high precision.

An aspect of the invention is to provide a lithographic apparatus and device manufacturing method, wherein parts of the apparatus may be fastened and held in desired positions with high accuracy.

An aspect of the invention is to provide a lithographic apparatus and device manufacturing method, wherein drift of components, which are locked in desired positions, may be prevented.

According to an aspect of the invention, there is provided a lithographic apparatus including an illumination system for providing a beam of radiation, and a support structure for supporting a patterning device. The patterning device serves to impart the beam of radiation with a pattern in its cross-section. The apparatus also includes a substrate table for holding a substrate, and a projection system for projecting the patterned beam onto a target portion of the substrate. The apparatus further includes at least one fastener for fastening at least a first part of the apparatus to at least a second part of the apparatus. The fastener includes a shaft having a first threaded section and a second threaded section of different pitches.

In this way, the first and second apparatus part may be fastened or clamped to each other, using a relatively low tightening torque during the tightening of the fastener. Therefore, the chances of the apparatus parts shifting with respect to each other during the tightening of the fastener is relatively low. Also, during assembly, the fastener may provide a desired relatively high clamping force for locking at least the one apparatus part firmly to the other under the application of the relatively low torque. Furthermore, after assembly, the fastener may induce relatively low internal stresses in the apparatus parts, so that stress related damaging and/or deformation and/or drift of the apparatus parts is prevented. The present invention is particularly advantageous for locking relatively fragile apparatus components precisely in desired operating positions. Such components may be, for example, adjustable optical elements, for example, mirrors and/or lenses, leaf-springs, wire-springs, quartz components, for example, quartz plates, and/or other components.

The fastener, which includes a shaft having a first threaded section and a second threaded section of different pitch, can also be called a 'differential screw thread' fastener. It is noted that fasteners including differential screw thread as such are described in U.S. Pat. No. 4,959,938 and U.S. Pat. No. 5,217,339. However, these fasteners are used for roofing systems and are further arranged to apply high torques to roofing components. In U.S. Pat. No. 3,727,471, a differential screw mechanism is described for both coarse and fine adjustment of a movable mirror. The present invention is based on the innovative concept, that a shaft having a first threaded section and a second threaded section of a different pitch is particularly advantageous in locking lithographic apparatus part in desired positions, for avoiding any further movement or drift of the parts with respect to each other after assembly.

According to an aspect of the invention there is provided the use of an apparatus in the manufacturing of devices. The apparatus includes an illumination system for providing a beam of radiation, and a support structure for supporting a patterning device. The patterning device serves to impart the beam of radiation with a pattern in its cross-section. The apparatus also includes a substrate table for holding a substrate, and a projection system for projecting the patterned beam onto a target portion of the substrate. The apparatus further includes at least one fastener for fastening a first part of the apparatus to a second part of the apparatus. The fastener includes a shaft having a first threaded section and a second threaded section of different pitches.

According to a further aspect of the invention, there is provided a device manufacturing method using a lithographic apparatus. The method includes providing a substrate, providing a beam of radiation using an illumination system, using a patterning device to impart the beam of radiation with a pattern in its cross-section; and projecting the patterned beam of radiation onto a target portion of the substrate. At least a first part of the apparatus is fastened to at least a second part of the apparatus by at least one fastener. The fastener includes a shaft having a first threaded section and a second threaded section of different pitches.

This may provide the above-mentioned advantages, particularly concerning the avoidance or reduction of drift of apparatus components, so that devices can be manufactured with high precision.

According to an other aspect of the invention, a device manufacturing method using a lithographic apparatus is provided. The method includes providing a substrate, providing a beam of radiation using an illumination system, using a patterning device to impart the beam of radiation with a pattern in its cross-section, and projecting the patterned beam of radiation onto a target portion of the substrate. At least a first part of the apparatus is clamped between at least a second part of the apparatus and at least one clamping part utilizing at least one fastener. The fastener includes at least a shaft having a first and a second threaded section of different pitches.

For example, the first threaded section of the fastener shaft may cooperate with a threaded opening of the clamping part. The second threaded section of the fastener may cooperate with a threaded opening of the second apparatus part. Also, the position the first apparatus part may be adjusted with respect to the second apparatus part during assembly, for example, to a operating position, after which the fastener is tightened for locking the position of the first apparatus part with respect to the second apparatus part. Thus, the first apparatus part may be locked in a relatively precise, desired operating position for a relatively long period of time.

According to an aspect of the invention, there is provided a device manufacturing method using a lithographic apparatus. The method includes projecting a pattern from a patterning device onto a substrate. At least a first part of a lithographic projection apparatus is fastened to at least a second part of the apparatus by at least one fastener. The fastener includes at least a shaft having a first threaded section and a second threaded section of different pitches.

According to an aspect of the invention, there is also provided a lithographic apparatus that is arranged to project a pattern from a patterning device onto a substrate. The apparatus includes at least one fastener for fastening at least a first part of the apparatus to at least a second part of the apparatus. The fastener includes a shaft having a first threaded section and a second threaded section of different pitches.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in, for example, a track (a tool that typically applies a layer of resist to a substrate and develops the exposed resist) or a metrology or inspection tool. Where applicable, the disclosure herein may be applied to such and other substrate processing tools. Further, the substrate may be processed more than once, for example, in order to create a multi-layer IC, so that the term substrate used herein may also refer to a substrate that already contains multiple processed layers.

The terms "radiation" and "beam" used herein encompass all types of electromagnetic radiation, including ultraviolet (UV) radiation (e.g. having a wavelength of 365, 248, 193, 157 or 126 nm) and extreme ultra-violet (EUV) radiation (e.g. having a wavelength in the range of 5-20 nm), as well as particle beams, such as ion beams or electron beams.

The term "patterning device" as used herein should be broadly interpreted as referring to a device that can be used to impart a projection beam with a pattern in its cross-section such as to create a pattern in a target portion of the substrate. It should be noted that the pattern imparted to the projection beam may not exactly correspond to the desired pattern in the target portion of the substrate. Generally, the pattern imparted to the projection beam will correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions; in this manner, the reflected beam is patterned. In each example of patterning device, the support structure may be a frame or table, for example, which may be fixed or movable as required and which may ensure that the patterning device is at a desired position, for example with respect to the projection system. Any use of the terms "reticle" or "mask" herein may be considered synonymous with the more general term "patterning device".

The term "projection system" as used herein should be broadly interpreted as encompassing various types of projection system, including refractive optical systems, reflective optical systems, and catadioptric optical systems, as appropriate for example for the exposure radiation being used, or for other factors such as the use of an immersion fluid or the use of a vacuum. Any use of the term "lens" herein may be considered as synonymous with the more general term "projection system".

The illumination system may also encompass various types of optical components, including refractive, reflective, and catadioptric optical components for directing, shaping, or controlling the projection beam of radiation, and such components may also be referred to below, collectively or singularly, as a "lens".

The lithographic apparatus may be of a type having two (dual stage) or more substrate tables (and/or two or more mask tables). In such "multiple stage" machines the additional tables may be used in parallel, or preparatory steps may be carried out on one or more tables while one or more other tables are being used for exposure.

The lithographic apparatus may also be of a type wherein the substrate is immersed in a liquid having a relatively high refractive index, e.g. water, so as to fill a space between the final element of the projection system and the substrate. Immersion liquids may also be applied to other spaces in the lithographic apparatus, for example, between the mask and the first element of the projection system. Immersion techniques are well known in the art for increasing the numerical aperture of projection systems.

BRIEF DESCRIPTION OF THE DRAWINGS

Embodiments of the invention will now be described, by way of example only, with reference to the accompanying schematic drawings in which corresponding reference symbols indicate corresponding parts.

DETAILED DESCRIPTION

Unless specifically indicated, in this application, terms such as 'circa', 'about' or similar terms should be understood as meaning a value which can at least deviate plus and minus 10% from a mentioned value.

Figure 1:
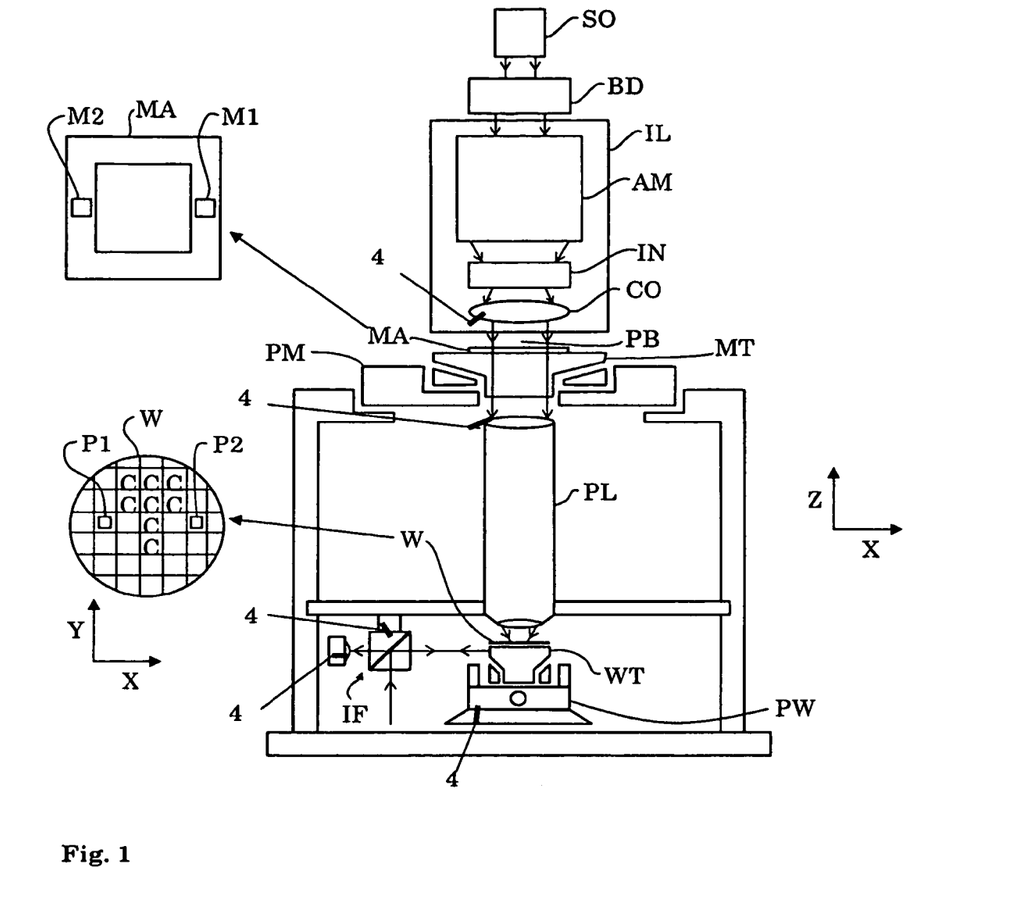
FIG. 1 depicts a lithographic apparatus according to an embodiment of the invention.

FIG. 1 schematically depicts a lithographic apparatus according to an embodiment of the invention. The apparatus includes an illumination system (illuminator) IL for providing a projection beam PB of radiation (e.g. UV radiation, EUV radiation or an other type of radiation), a first support structure (e.g. a mask table) MT for supporting a patterning device (e.g. a mask) MA and connected to a first positioning device PM for accurately positioning the patterning device with respect to item PL, a substrate table (e.g. a wafer table) WT for holding a substrate (e.g. a resist-coated wafer) W and connected to a second positioning device PW for accurately positioning the substrate with respect to item PL, and a projection system (e.g. a refractive projection lens) PL for imaging a pattern imparted to the projection beam PB by the patterning device MA onto a target portion C (e.g. including one or more dies) of the substrate W.

As here depicted, the apparatus is of a transmissive type (e.g. employing a transmissive mask). Alternatively, the apparatus may be of a reflective type (e.g. employing a programmable mirror array of a type as referred to above).

The illuminator IL receives a beam of radiation from a radiation source SO. The source and the lithographic apparatus may be separate entities, for example, when the source is an excimer laser. In such cases, the source is not considered to form part of the lithographic apparatus and the radiation beam is passed from the source SO to the illuminator IL with the aid of a beam delivery system BD including, for example, suitable directing mirrors and/or a beam expander. In other cases, the source may be integral part of the apparatus, for example, when the source is a mercury lamp. The source SO and the illuminator IL, together with the beam delivery system BD if required, may be referred to as a radiation system.

The illuminator IL may include an adjusting device AM for adjusting the angular intensity distribution of the beam. Generally, at least the outer and/or inner radial extent (commonly referred to as s-outer and s-inner, respectively) of the intensity distribution in a pupil plane of the illuminator can be adjusted. In addition, the illuminator IL generally includes various other components, such as an integrator IN and a condenser CO. The illuminator provides a conditioned beam of radiation, referred to as the projection beam PB, having a desired uniformity and intensity distribution in its cross-section.

The projection beam PB is incident on the mask MA, which is held on the mask table MT. Having traversed the mask MA, the projection beam PB passes through the lens PL, which focuses the beam onto a target portion C of the substrate W. With the aid of the second positioning device PW and position sensor IF (e.g. an interferometric device), the substrate table WT may be moved accurately, e.g. so as to position different target portions C in the path of the beam PB. Similarly, the first positioning device PM and another position sensor (which is not explicitly depicted in FIG. 1) may be used to accurately position the mask MA with respect to the path of the beam PB, e.g. after mechanical retrieval from a mask library, or during a scan. In general, movement of the object tables MT and WT will be realized with the aid of a long-stroke module (coarse positioning) and a short-stroke module (fine positioning), which form part of the positioning devices PM and PW. However, in the case of a stepper (as opposed to a scanner) the mask table MT may be connected to a short stroke actuator only, or may be fixed. Mask MA and substrate W may be aligned using mask alignment marks M1, M2 and substrate alignment marks P1, P2.

The depicted apparatus can be used in the following preferred modes:

1. In step mode, the mask table MT and the substrate table WT are kept essentially stationary, while an entire pattern imparted to the projection beam is projected onto a target portion C in one go (i.e. a single static exposure). The substrate table WT is then shifted in the X and/or Y direction so that a different target portion C can be exposed. In step mode, the maximum size of the exposure field limits the size of the target portion C imaged in a single static exposure.

2. In scan mode, the mask table MT and the substrate table WT are scanned synchronously while a pattern imparted to the projection beam is projected onto a target portion C (i.e. a single dynamic exposure). The velocity and direction of the substrate table WT relative to the mask table MT is determined by the (de-)magnification and image reversal characteristics of the projection system PL. In scan mode, the maximum size of the exposure field limits the width (in the non-scanning direction) of the target portion in a single dynamic exposure, whereas the length of the scanning motion determines the height (in the scanning direction) of the target portion.

3. In another mode, the mask table MT is kept essentially stationary holding a programmable patterning device, and the substrate table WT is moved or scanned while a pattern imparted to the projection beam is projected onto a target portion C. In this mode, generally, a pulsed radiation source is employed and the programmable patterning device is updated as required after each movement of the substrate table WT or in between successive radiation pulses during a scan. This mode of operation may be readily applied to maskless lithography that utilizes a programmable patterning device, such as a programmable mirror array of a type as referred to above.

Combinations and/or variations on the above described modes of use or entirely different modes of use may also be employed.

As shown schematically in FIG. 1, the apparatus includes fasteners 4 for locking various first apparatus parts in desired positions. Such first apparatus parts include, but are not limited to at least part of the illumination system IL; at least part of the support structure for supporting a patterning device MA; at least part of the substrate table WT; at least part of the projection system PL; an adjustable optical element, for example, a mirror or lens; a spring, for example, a leaf-spring or a wire-spring; and a quartz component, for example, a quartz plate.

The first apparatus part may be fastened to various second apparatus parts, for example, one or more frame parts, base parts and/or wall parts of the apparatus.

Figure 2:
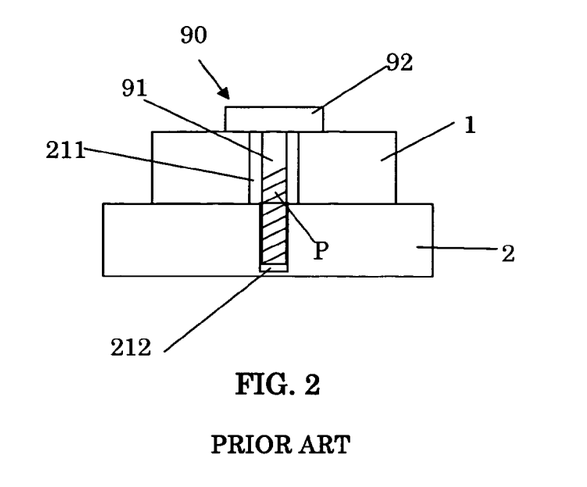
FIG. 2 depicts a partially opened side view of a fastening assembly according to the prior art.

FIG. 2 schematically shows an assembly with a known fastener for fastening parts 1, 2 of the lithographic apparatus. The known fastener is a screw or bolt 90 that includes a threaded shaft 91 and an integral screw head 92. The screw thread has a certain pitch. After assembly, the fastener 90 clamps a first apparatus part 1 onto a second apparatus part 2. To this aim, the first apparatus part 1 includes a through-hole 211, whereas the second apparatus part 2 includes an aperture 212 having inner screw thread for receiving and cooperating with the screw thread of the fastener 90. The pitch of the screw thread has been depicted by reference sign P. One problem of such a fastener 90 is that the head 92 of the fastener applies a torque onto the first apparatus part 1 during assembly, leading to a possible shift and/or internal stresses of that part 1.

Figure 3A:
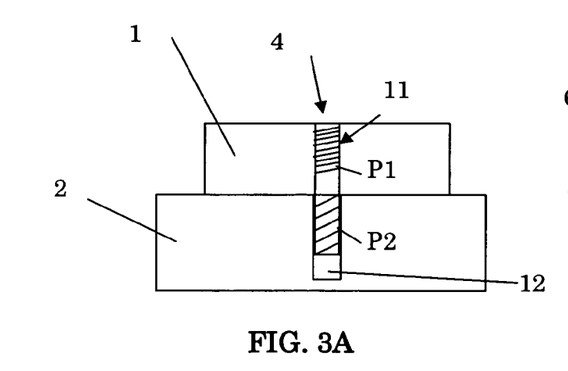
FIG. 3A shows a partially opened side view of an embodiment of a fastening assembly of the apparatus of FIG. 1.
Figure 3B:
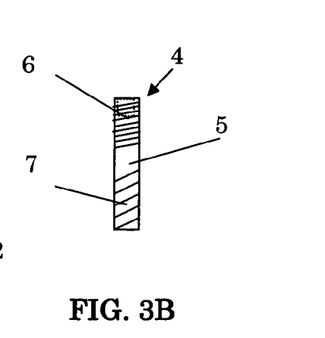
FIG. 3B shows a side view of a fastener of the fastening assembly of FIG. 3A.

FIGS. 3A and 3B schematically show a first embodiment according to the present invention. In the first embodiment, the fastener 4 includes a cylindrical shaft 5 having a first threaded section 6 and a second threaded section 7. The pitch of the first threaded section 6 is depicted by reference sign P1, whereas the pitch of the second threaded section 7 is depicted by P2. In the present embodiment, the pitch P1 of the first section 6 is smaller than the pitch P2 of the second section 7. Preferably, at least one end of the fastener 5 is arranged to be engaged by an appropriate tool, such as a screw driver or the like, for driving the fastener 4 into and out of respective threaded openings that are discussed below. At least one end of the fastener may include, for example, a suitable control device, such as a slit or aperture having a suitable form. The present fastener 4, according to the first embodiment, does not have a widened head part, such as the head of the prior art fastener as shown in FIG. 2.

In the embodiment shown in FIG. 3A, the first apparatus part 1 includes an opening 11 for receiving an upper part of the fastener 4. In particular, the opening 11 of the first apparatus part is a cylindrical bore, having an inner screw thread arranged for cooperation with the screw thread of the first section 6 of the fastener shaft 5.

Similarly, the second apparatus part 2 includes an opening 12, particularly a cylindrical bore, having an inner screw thread arranged for receiving and cooperation with the screw thread of the second section 7 of the shaft of the fastener 4.

The present fastener 4 is arranged, for example, for a clockwise tightening. During use, the fastener 4 can be rotated in a clock-wise direction into the openings of the first and second apparatus part. In that case, at least part of the first section 6 of the fastener 4 cooperates with the inner screw thread of the opening 11 of the first apparatus part, and at least part of the second section 7 of the fastener 4 cooperates with the inner screw thread of the opening 12 of the second apparatus part 2. When the fastener shaft 5 cooperates with the threads of both the first and second apparatus parts 1, 2, the apparatus parts will move towards each other to be clamped to one another.

Figure 4A:
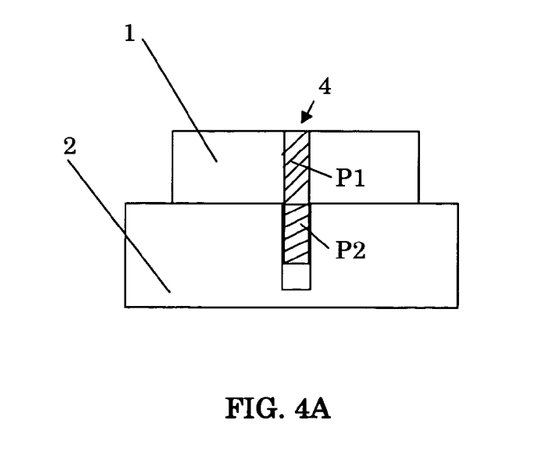
FIG. 4A shows a partially opened side view of an embodiment of a fastening assembly of the apparatus of FIG. 1.
Figure 4B:
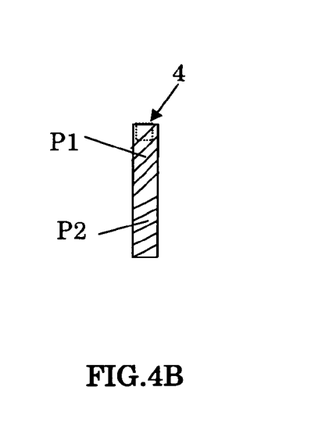
FIG. 4B shows a side view of a fastener of the fastening assembly of FIG. 4A.

FIGS. 4A and 4B show a second embodiment of the invention. In this embodiment, both sections of the shaft of the fastener are arranged for example, for a counter-clockwise tightening during use. This may be achieved by providing the first section of the shaft 6 with a thread having a pitch P1 which is greater than the pitch P2 of the thread of the second fastener section 7.

Preferably, in both embodiments, the second shaft part 7 has a smaller diameter than the first shaft part 6. The same holds for the respective openings 11, 12 of the apparatus parts 1, 2. Then, the fastener 4 may be assembled relatively easy into both apparatus parts 1, 2 when the apparatus parts 1, 2 are already substantially in the position of FIGS. 3A and 4A.

In both the first and second embodiment, the fastener 4 does not have a widened head part, such as the screwhead of the prior art fastener as shown in FIG. 2. Therefore, during assembly, when the fastener 4 is turned into the first and second apparatus part, there is no fastener head, so that the position of the first apparatus part 1 with respect to the second apparatus part 2 may be relatively less disturbed during the assembly and may be preserved accurately for relatively long periods of time. This is further improved as a result of a relatively low fastening torque needed for achieving a certain desired clamping force between the two apparatus parts. This is explained in the following numerical example.

In this example, the amount of torque needed to clamp the first and second apparatus part together is calculated for the prior art fastener, shown in FIG. 2, with respect of the fastener according to the present invention as shown in FIG. 3B or 4B.

For the common screw fastener 90 (see FIG. 2), a tightening torque $M_t$ (Nm) required to produce a certain mounting force $F_m$ (kN) is approximately given by (see for example, Decker, Karl-H., "Maschinenelemente. Gestaltung und Berechnung", Carl Hanser Verlag München Wien, 1990):

$$M_t = F_m \cdot (\text{thread-pitch factor} + \text{thread-friction factor} + \text{head-friction factor}) \tag{1a}$$

or:

$$M_t = F_m \cdot (0.16 \cdot P + 0.58 \cdot \mu_p \cdot D_p + 0.5 \cdot \mu_h \cdot D_h) \tag{1b}$$

wherein: P is the pitch of the screw thread (mm), $\mu_p$ is the friction coefficient in the thread windings, $\mu_h$ is the friction coefficient in the pivot face of the screwhead, $D_p$ is the pitch diameter of the thread windings (mm), and $D_h$ is the average contact-diameter of the pivot face of the screwhead (mm).

For the differential screw mounting, as shown in FIGS. 3A and 4A, the torque $M_{td}$ can be derived from this formula (1b) by replacing the pitch P by the effective differential screw pitch (P1−P2)=ΔP, and by removing the head-friction factor, and by adding a second thread-friction factor. This leads to the following formula (2):

$$M_{td} = F_m \cdot (0.16 \cdot \Delta P + 0.58 \cdot \mu_{p1} \cdot D_{p1} + 0.58 \cdot \mu_{p2} \cdot D_{p2}) \quad (2)$$

wherein $\mu_{p1}$ is the friction coefficient in the thread windings P1 of the first shaft section 6, $\mu_{p2}$ is the friction coefficient in the thread windings P2 of the second shaft section 7, $D_{p1}$ is the pitch diameter of the first thread windings P1 (mm) and $D_{p2}$ is the pitch diameter of the second thread windings P2 (mm).

It is noted that all friction factors involved in formulas (1b) and (2) will have identical values, provided that material combinations in the respective assemblies of FIGS. 2-4 are consistent with each other. It is also noted that the pitch diameter of the second thread windings $D_{p2}$ will be significantly smaller than the average contact-diameter of the pivot face of the screwhead $D_h$. Also, $\Delta P$ can be significantly smaller than P, for example, by a factor 10 or more.

Comparing formulas (1b) and (2) leads to the result that the torque needed for tightening the differential screw fastener 4 to a required clamping force may be significantly smaller that for a regular screw 90 with similar thread dimensions.

Figure 5A:
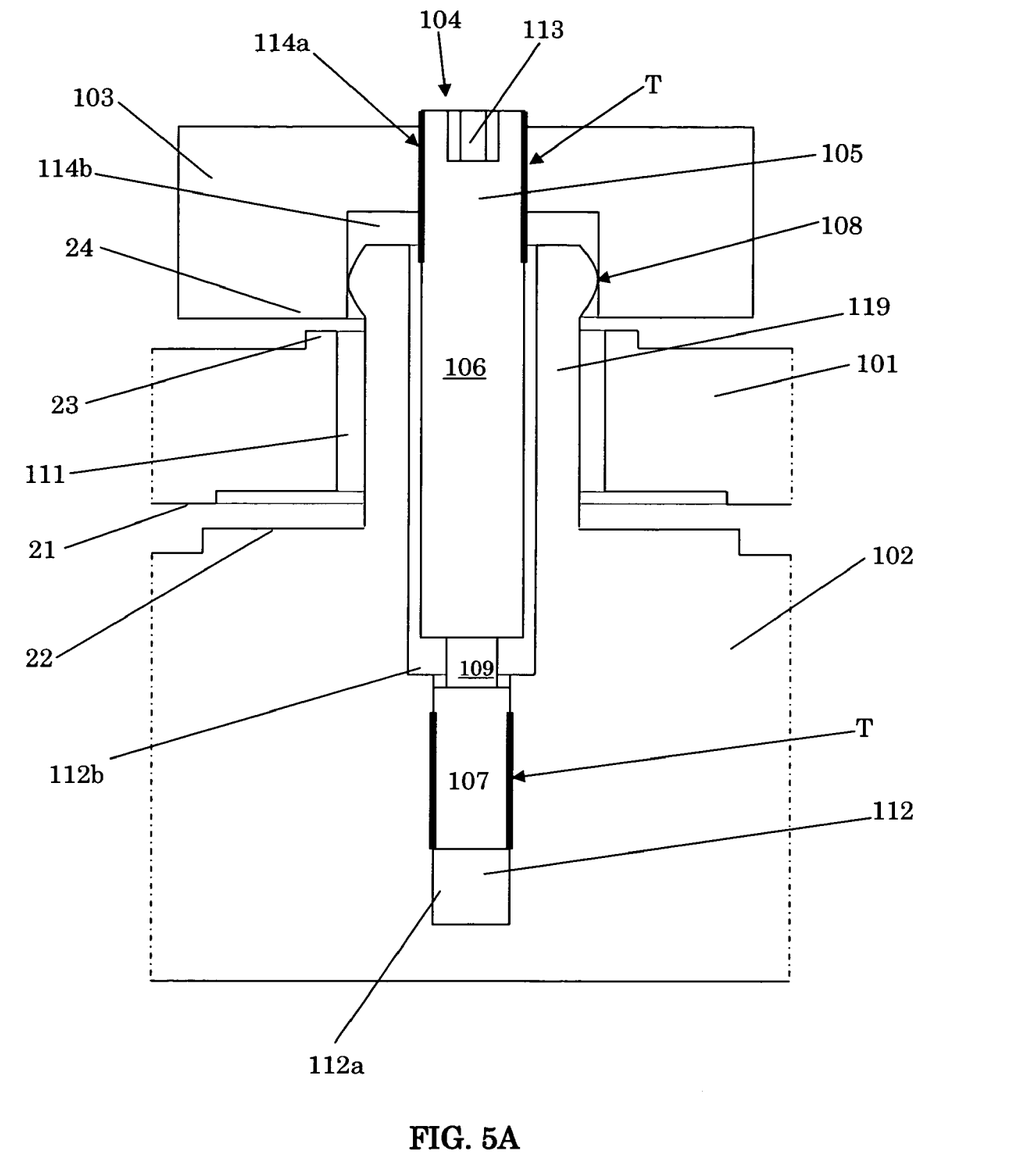
FIG. 5A shows a partially opened side view of an embodiment of a fastening assembly of FIG. 1.
Figure 5B:
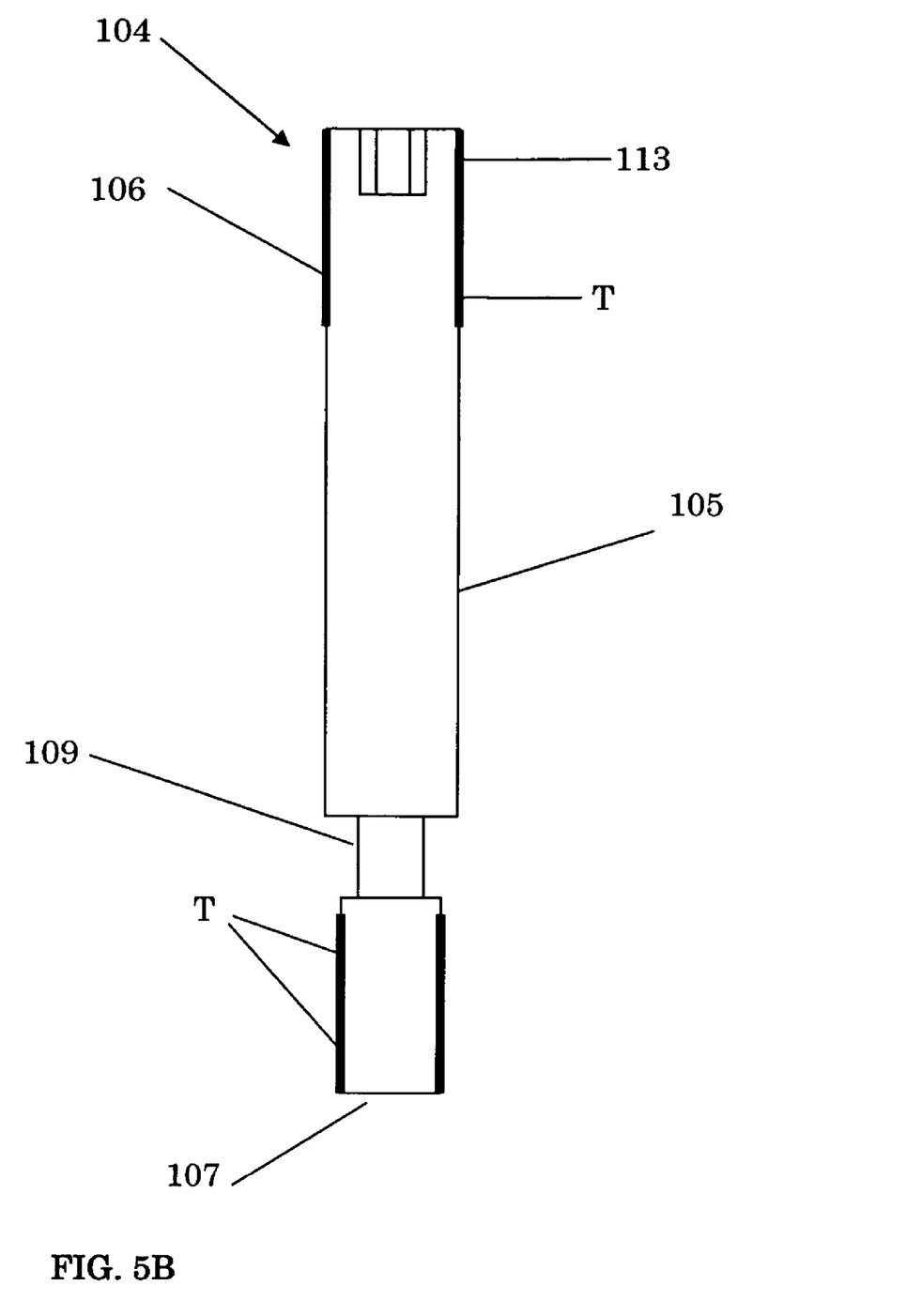
FIG. 5B shows a side view of a fastener of the fastening assembly of FIG. 5A.

FIGS. 5A and 5B schematically show a third embodiment of the invention. The third embodiment includes a first part 101 of a lithographic apparatus and a second part 102 of the apparatus. A fastener 104 has been provided for joining the first and second apparatus part 101, 102, using a further clamping part 103, for example, a separate nut plate or the-like element. Particularly, the first part 101 of the apparatus is clamped between the second apparatus part 102 and the clamping part 103 by the fastener 104.

As has been shown in FIG. 5B, the fastener 104 of the third embodiment includes a cylindrical shaft 105 having a first threaded section 106, and a second threaded section 107 having a thread of different pitch than the thread of the first section 106. In FIGS. 5A, 5B, the thread has been depicted schematically by thick lines T.

The shaft of the fastener 104 includes a narrowed third section 109 extending between the first and second shaft sections 106, 107. The diameter of the second threaded section 107 of the shaft 105 is smaller than the diameter of the first section 106 of the shaft 105.

The top end of the shaft 105 is arranged to be engaged by an appropriate tool, such as a screw driver or the like, for driving the fastener into and out of respective threaded openings. In the present embodiment, the shaft top end includes an aperture 113 having a suitable form to be engaged by a driving tool.

The first apparatus part 101 may be, for example, a position adjustable component of the lithographic apparatus. The first apparatus part 101 includes a cylindrical through-hole 111 for receiving a hollow guiding shaft 119 of the second apparatus part 102. The diameter of this through-hole 111 is somewhat larger than the outer diameter of the hollow guiding shaft 119, extending there-through after assembly, such that a position of the first apparatus part 101 is adjustable over a certain range with respect to the second apparatus part 102 before or during assembly.

Furthermore, the hollow guiding shaft 119 of the second apparatus part 102 extends into a receiving aperture 114b of clamping part 103. The hollow shaft 119 of the second apparatus 102 part provides a number of the guiding protrusions 108 at its end, for cooperation with the clamping part 103. These guiding protrusions 108 further provide the device to eliminate radial play of part 103 with respect to part 102, thus centering clamping part 103 and fastener 104 during assembly.

The clamping part 103 has through-hole 114a, including inner screw thread for cooperation with the screw thread of the first section of the shaft 105 of the fastener. Particularly, the clamping part 103 may be viewed as being a widened head part of the fastener, extending on one end of the shaft 105 of the fastener 104, which head part is rotatably connected to the shaft 105.

In the third embodiment, the second apparatus part 102 may be, for example, a mounting base or the-like. The second apparatus part 102 includes an aperture 112. This aperture 112 includes a first section 112a, having inner screw thread for cooperation with the thread of the second section 107 of the shaft of the fastener 104. The aperture 112 also includes a wider second section 112b extending from the first section 112a towards the clamping part 103 after assembly. The diameter of this wider section 112b is larger than the diameter of threaded section 106 of the fastener to avoid undesirable run-out friction during assembly. In the present embodiment, this wider section 112b is the interior space of the hollow guiding shaft 119.

In the present embodiment, the surface of the first apparatus part 101, faced towards the second apparatus part 102, includes a first ring shaped face 21 extending concentrically with respect to the fastener 106 after assembly. The opposite surface of the second apparatus part 102 includes a second ring shaped face 22, also extending concentrically with respect to the fastener 106 after assembly. The first ring face 21 overlaps over a certain, relatively small radial distance, with the second ring face part 22 after assembly, when viewed in axial direction.

Also, in the present embodiment, the surface of the first apparatus part 101, faced towards the clamping part 103, includes a third ring shaped face 23 extending around, particularly substantially concentrically with respect to, the fastener 106 after assembly. The opposite surface of the clamping part 103 includes a fourth ring shaped face 24, also extending concentrically with respect to the fastener 106 after assembly. The third ring shaped face 23 overlaps over a certain, relatively small radial distance, with the fourth ring face 24 after assembly, viewed in axial direction (see FIG. 5A). The average diameter of the radial overlap of the first and second ring shaped surfaces 21, 22 is larger than the average diameter of the overlap of the third and fourth ring shaped faces 23, 24.

Therefore, the first and second apparatus part 101, 102, may be clamped together, using relatively small abutting clamping surfaces of the ring shaped faces and opposite ring shaped grooves, so that a relatively accurate positioning of the first apparatus part 101 can be achieved and upheld with respect to the second apparatus part 102. Because of the diameters of the overlap of the ring faces 21, 22, 23, 24, rotation of the first apparatus part 101 is prevented during assembly, when the fastener 104 is being turned for providing a desired clamping force whilst the ring shaped faces 21, 22, 23, 24 make contact.

During use of the third embodiment, the fastener 104 is fed into the apertures 114a, 112b and 112a of the clamping part 103 and the second apparatus part 102, as is shown in FIG. 5A. When the fastener is turned into an appropriate fastening direction, which depends on the pitch of the screw thread of the first and second shaft section 106, 107, the clamping part 103 and second apparatus part 102 move towards each other, such that the first apparatus part 101 is clamped there between. Since the first and second shaft section 106, 107 have screw thread of different pitch, a relatively high clamping force can be achieved without having to apply relatively high fastening torques. Thus, the position of the first and second apparatus part 101, 102 with respect to each other is maintained precisely during clamping. An aligned position may also be upheld for long periods of time, particularly because the present fastener provides a clamping with relatively little internal stress in the apparatus parts 101, 102.

The third embodiment may be used in a mounting method for a body that is re-adjustable in three degrees of freedom.

While specific embodiments of the invention have been described above, it will be appreciated that the invention may be practiced otherwise than as described. The description is not intended to limit the invention.

For example, the present invention may be used for neutral locking various components to a base or the-like, for example, position/rotation-adjusted components.

The fastener may have various dimensions, diameters and the-like, for example, standardized dimensions, certain standard nominal thread sizes and/or different sizes.

What is claimed is:

1. A lithographic apparatus comprising:
an illumination system for conditioning a beam of radiation;
a support structure for supporting a patterning device, the patterning device serving to impart the beam of radiation with a pattern in its cross-section;
a substrate table for holding a substrate;
a projection system for projecting the patterned beam onto a target portion of the substrate; and
at least one fastener for fastening a first part of the apparatus to a second part of the apparatus, said first apparatus part comprising an opening for receiving part of said fastener, said second apparatus part comprising an opening for receiving another part of said fastener, said fastener comprising a shaft having a first threaded section and a second threaded section, wherein the first threaded section and the second threaded section have different pitches, and wherein the fastener does not comprise an integral widened head part extending from one end of the shaft.

2. An apparatus according to claim 1, wherein the opening of the first apparatus part has an inner screw thread for cooperation with the first threaded section of the shaft of the fastener.

3. An apparatus according to claim 1, wherein the opening of the second apparatus part has an inner screw thread for cooperation with the second threaded section of the shaft of the fastener.

4. An apparatus according to claim 3, wherein said first part of the apparatus is clamped between said second apparatus part and a clamping part by the fastener.

5. An apparatus according to claim 4, wherein the first part of the apparatus comprises a through-hole for receiving part of the fastener after assembly.

6. An apparatus according to claim 5, wherein the clamping part comprises an opening having an inner screw thread for cooperation with the first threaded section of the fastener shaft.

7. An apparatus according to claim 5, wherein the diameter of the through-hole of the first apparatus part is larger than the diameter of the fastener shaft part extending therethrough after assembly, such that the position of the first apparatus part is adjustable with respect to the second apparatus part during assembly.

8. An apparatus according to claim 4, wherein the second apparatus part comprises a first ring shaped face extending around said fastener after assembly, wherein said first apparatus part comprises a second ring shaped face extending around said fastener after assembly, wherein said ring shaped faces overlap after assembly.

9. An apparatus according to claim 8, wherein the first apparatus part comprises a third ring shaped face extending around said fastener after assembly, wherein said clamping part comprises a fourth ring shaped face extending around said fastener after assembly, and wherein said third ring shaped face and fourth ring shaped face overlap after assembly.

10. An apparatus according to claim 9, wherein the average diameter of the overlap of the first and second ring shaped faces is larger than the average diameter of the overlap of the third and fourth ring shaped faces.

11. An apparatus according to claim 3, wherein the opening of the second apparatus part comprises a first section having an inner screw thread for cooperation with the second section of the shaft of the fastener, and a wider second section extending from the first section towards the first apparatus part.

12. An apparatus according to claim 1, wherein at least part of the first threaded section of the fastener cooperates with an inner screw thread of the opening of the first apparatus part, and wherein at least part of the second threaded section of the fastener cooperates with an inner screw thread of the opening of the second apparatus part.

13. An apparatus according to claim 12, wherein the second apparatus part comprises a first ring shaped face extending around said fastener after assembly, wherein said first apparatus part comprises a second ring shaped face extending around said fastener after assembly, and wherein said ring shaped faces overlap after assembly.

14. An apparatus according to claim 1, wherein the first threaded section and the second threaded section of the shaft of the fastener are arranged for a clockwise tightening during use.

15. An apparatus according to claim 1, wherein the first threaded section and the second threaded section of the shaft of the fastener are arranged for a counter-clockwise tightening during use.

16. An apparatus according to claim 1, wherein the fastener comprises a clamping part having a threaded opening cooperating with the first threaded section of the shaft for relative rotational movement between the clamping part and the shaft.

17. An apparatus according to claim 1, wherein the shaft of said fastener comprises a narrowed third section extending between said first threaded shaft section and said second threaded shaft section.

18. An apparatus according to claim 1, wherein the diameter of the second threaded section of the shaft is smaller than the diameter of the first threaded section of the shaft.

19. An apparatus according to claim 1, wherein said second apparatus part is a frame part, base part and/or a wall part of the apparatus.

20. An apparatus according to claim 1, wherein said first apparatus part and/or said second apparatus part comprises at least part of the illumination system, at least part of the support structure for supporting the patterning device, at least part of the substrate table, at least part of the projection system, an adjustable optical element, a spring, and/or a quartz component.

21. A device manufacturing method using a lithographic apparatus, the method comprising:
  patterning a beam of radiation; and
  projecting the patterned beam of radiation onto a target portion of a substrate,
  wherein a first part of the apparatus is fastened to a second part of the apparatus by at least one fastener, said first apparatus part comprising an opening for receiving part of said fastener, said second apparatus part comprising an opening for receiving another part of said fastener, said fastener comprising a shaft having a first threaded section and a second threaded section, wherein said first threaded section and said second threaded section have different pitches, and wherein the fastener does not comprise an integral widened head part extending from one end of the shaft.

22. A method according to claim 21, wherein said first threaded section of said fastener shaft cooperates with a threaded opening of the first apparatus part, and wherein said second threaded section of said fastener cooperates with a threaded opening of said second apparatus part.

23. A method according to claim 21, wherein said second apparatus part is a frame part, base part and/or a wall part of the apparatus.

24. A method according to claim 21, wherein said first apparatus part and/or second apparatus part comprises at least part of an illumination system, at least part of the support structure for supporting a patterning device that patterns the beam of radiation, at least part of a substrate table that supports the substrate, at least part of a projection system that projects the patterned beam of radiation, an adjustable optical element, a spring, and/or a quartz component.

25. A device manufacturing method using a lithographic apparatus, the method comprising:
  patterning a beam of radiation; and
  projecting the patterned beam of radiation onto a target portion of a substrate,
  wherein a first part of the apparatus is clamped between a second part of the apparatus and a clamping part, said clamping part utilizing at least one fastener, wherein said fastener comprises a shaft having a first threaded section and a second threaded section, wherein said first threaded section and said second threaded section have different pitches, and wherein the fastener does not comprise an integral widened head part extending from one end of the shaft.

26. A method according to claim 25, wherein said first threaded section of said fastener shaft cooperates with a threaded opening of said clamping part, and wherein said second threaded section of said fastener cooperates with a threaded opening of said second apparatus part.

27. A method according to claim 25, wherein a position said first apparatus part is adjusted with respect to the second apparatus part during assembly of the apparatus, after which the fastener is tightened for locking the position of the first apparatus part with respect to the second apparatus part.

28. A method according to claim 25, wherein said second apparatus part is a frame part, base part and/or a wall part of the apparatus.

29. A method according to claim 25, wherein said first apparatus part and/or second apparatus part comprises at least part of an illumination system, at least part of the support structure for supporting a patterning device that patterns the beam of radiation, at least part of a substrate table that supports the substrate, at least part of a projection system that projects the patterned beam of radiation, an adjustable optical element, a spring, and/or a quartz component.

30. A device manufacturing method using a lithographic apparatus, the method comprising patterning a beam of radiation onto a substrate, wherein a first part of the lithographic apparatus is fastened to a second part of the apparatus by at least one fastener, said first apparatus part comprising an opening for receiving part of said fastener, said second apparatus part comprising an opening for receiving another part of said fastener, wherein said fastener comprises a shaft having a first threaded section and a second threaded section, the first threaded section having a pitch that is different from a pitch of the second threaded section, and wherein the fastener does not comprise an integral widened head part extending from one end of the shaft.

31. A lithographic apparatus arranged to project a pattern from a patterning device onto a substrate, the apparatus comprising at least one fastener for fastening a first part of the apparatus to a second part of the apparatus, said first apparatus part comprising an opening for receiving part of said fastener, said second apparatus part comprising an opening for receiving another part of said fastener, wherein said fastener comprises a shaft having a first threaded section with a first pitch and a second threaded section with a second pitch that is different than the first pitch, and wherein the fastener does not comprise an integral widened head part extending from one end of the shaft.

32. An apparatus according to claim 31, wherein the opening of the first apparatus part has an inner screw thread for cooperation with the first section of the shaft of the fastener.

33. An apparatus according to claim 31, wherein the opening of said second apparatus part has an inner screw thread for cooperation with the second section of the shaft of the fastener.

34. An apparatus according to claim 33, wherein said first part of the apparatus is clamped between said second part of the apparatus and a clamping part by said at least one fastener.

35. An apparatus according to claim 34, wherein the first apparatus part comprises a through-hole for receiving part of the fastener after assembly.

36. An apparatus according to claim 35, wherein the clamping part comprises at least one opening having an inner screw thread for cooperating with the first threaded section of the fastener shaft.

37. An apparatus according to claim 35, wherein the diameter of the through-hole of the first apparatus part is larger than the diameter of the fastener shaft part extending there-through after assembly, such that a position of the first apparatus part is adjustable with respect to the second apparatus part during assembly.

38. An apparatus according to claim 34, wherein the second apparatus part comprises a first ring shaped face extending around said fastener after assembly, wherein said first apparatus part comprises a second ring shaped face extending around said fastener after assembly, and wherein said first and second ring shaped faces overlap after assembly.

39. An apparatus according to claim 38, wherein the first apparatus part comprises a third ring shaped face extending around said fastener after assembly, wherein said clamping part comprises a fourth ring shaped face extending around said fastener after assembly, and wherein said third ring shaped face and fourth ring shaped face overlap after assembly.

40. An apparatus according to claim 39, wherein the average diameter of the overlap of the first and second ring shaped faces is larger than the average diameter of the overlap of the third and fourth ring shaped faces.

41. An apparatus according to claim 34, wherein the first apparatus part comprises a cylindrical through-hole for receiving a hollow guiding shaft of the second apparatus part, and wherein the clamping part comprises a receiving aperture for receiving part of said guiding shaft.

42. An apparatus according to claim 41, wherein the hollow guiding shaft of the second apparatus part comprises a plurality of guiding protrusions at one end for cooperating with the clamping part during and/or after assembly.

43. An apparatus according to claim 41, wherein the diameter of the through-hole of the first apparatus part is larger than the outer diameter of said hollow guiding shaft, extending there-through after assembly such that a position of the first apparatus part is adjustable over a certain range with respect to the second apparatus part before and/or during assembly.

44. An apparatus according to claim 33, wherein the at least one opening of the second apparatus part comprises a first section, having the inner screw thread for cooperation with the second section of the shaft of the fastener, and a wider second section extending from the first section towards the first apparatus part.

45. An apparatus according to claim 31, wherein at least part of the first section of the fastener cooperates with an inner screw thread of the opening of the first apparatus part, and wherein at least part of the second section of the fastener cooperates with an inner screw thread of the opening of the second apparatus part.

46. An apparatus according to claim 45, wherein the second apparatus part comprises a first ring shaped face extending around said fastener after assembly, wherein said first apparatus part comprises a second ring shaped face extending around said fastener after assembly, and wherein said first and second ring shaped faces overlap after assembly.

47. An apparatus according to claim 31, wherein both threaded sections of the shaft of the fastener are arranged for a clockwise tightening during use.

48. An apparatus according to claim 31, wherein both threaded sections of the shaft of the fastener are arranged for a counter-clockwise tightening during use.

49. An apparatus according to claim 31, wherein the fastener comprises a clamping part having a threaded opening cooperating with the first threaded section of the shaft for relative rotational movement between the clamping part and the shaft.

50. An apparatus according to claim 31, wherein the shaft of said fastener comprises a narrowed third section extending between said first threaded section and said second threaded section.

51. An apparatus according to claim 31, wherein the diameter of the second threaded section of the shaft is smaller than the diameter of the first threaded section of the shaft.

52. An apparatus according to claim 31, wherein said second apparatus part is a frame part, base part and/or a wall part of the apparatus.

53. An apparatus according to claim 31, wherein said first apparatus part and/or second apparatus part comprises at least part of an illumination system, at least part of a support structure for supporting the patterning device, at least part of a substrate table that supports the substrate, at least part of a projection system that projects the pattern from the patterning device, an adjustable optical element, a spring and/or a quartz component.

* * * * *